US006823124B1

(12) United States Patent
Renn et al.

(10) Patent No.: US 6,823,124 B1
(45) Date of Patent: Nov. 23, 2004

(54) LASER-GUIDED MANIPULATION OF NON-ATOMIC PARTICLES

(75) Inventors: Michael J. Renn, Albequerque, NM (US); David J. Odde, New Brighton, MN (US); Robert L. Pastel, Houghton, MI (US)

(73) Assignee: Optomec Design Company, Albuquerque, NM (US)

( * ) Notice: Subject to any disclaimer, the term of this patent is extended or adjusted under 35 U.S.C. 154(b) by 0 days.

(21) Appl. No.: 09/574,955

(22) Filed: May 19, 2000

Related U.S. Application Data

(63) Continuation of application No. 09/408,621, filed on Sep. 30, 1999, now abandoned.
(60) Provisional application No. 60/102,418, filed on Sep. 30, 1998.

(51) Int. Cl.$^7$ .............................................. G02B 6/20
(52) U.S. Cl. ..................... 385/125; 385/147; 427/180
(58) Field of Search ............................... 385/125, 147; 427/553–555, 180

(56) References Cited

U.S. PATENT DOCUMENTS

| | | | |
|---|---|---|---|
| 3,808,432 A | | 4/1974 | Ashkin |
| 3,808,550 A | * | 4/1974 | Ashkin ..................... 372/97 |
| 4,016,417 A | | 4/1977 | Benton |
| 4,453,803 A | | 6/1984 | Hidaka et al. |
| 5,170,890 A | | 12/1992 | Wilson et al. |
| 5,194,297 A | | 3/1993 | Scheer et al. |
| 5,254,832 A | | 10/1993 | Gartner et al. |
| 5,366,559 A | * | 11/1994 | Periasamy ..................... 134/1 |
| 5,495,105 A | * | 2/1996 | Nishimura et al. ......... 250/251 |
| 5,648,127 A | | 7/1997 | Turchan et al. |
| 5,854,311 A | * | 12/1998 | Richart ..................... 523/309 |
| 5,993,549 A | * | 11/1999 | Kindler et al. .............. 118/308 |
| 6,151,435 A | * | 11/2000 | Pilloff ..................... 385/125 |
| 6,251,488 B1 | * | 6/2001 | Miller et al. ................ 427/596 |

OTHER PUBLICATIONS

*The American Society for Cell Biology Thirty–Seventh Annual Meeting*, Special Poster Session, 11 pages, (Dec. 1997).

Lewandowski, H.J., et al., "Laser Guiding of Microscopic Particles in Hollow Optical Fibers", *Announcer*, 27, Summer Meeting–Invited and Contributed Abstracts, p. 89, (Jul. 1997).

Renn, M.J., et al., "Evanescent–wave guiding of atoms in hollow optical fibers", *Physical Review A*, 55(2), pp. 648–652, (Feb. 1996).

Renn, M.J., et al., "Laser Guidance and Trapping of Mesoscale Particles in Hollow–Core Optical Fibers", *Physical Review Letters*, 82(7), pp. 1574–1577, (1999).

Renn, M.J., et al., "Laser–Guided Atoms in Hollow–Core Optical Fibers", *Physical Review A*, 55(5), pp. 3684–3696, (May 1997).

Renn, M.J., et al., "Optical–dipole–force fiber guiding and heating of atoms", *Physical Review A*, 55(5), pp. 3684–3696, (May 1997).

Renn, M.J., et al., "Particle Manipulation and Surface Patterening by Laser Guidance", *AIP for American Vacuum Soc. Journal of Vacuum Science & Technology B*, 16(6), 16 pages, (Nov. 1998).

(List continued on next page.)

*Primary Examiner*—John D. Lee
*Assistant Examiner*—Sarah U. Song
(74) *Attorney, Agent, or Firm*—Jeffrey D. Myers; Peacock, Myers & Adams, P.C.

(57) ABSTRACT

A method and device for using laser light to trap non-atomic particles optically within a hollow region of a hollow core optical fiber.

16 Claims, 10 Drawing Sheets

OTHER PUBLICATIONS

Renn, M.J., et al., "Particle manipulation and surface patterning by laser guidance", *J. Vac. Sci. Technol. B 16(6)*, pp. 2–6, (Nov./Dec. 1998).

Ashkin, A., "Acceleration and Trapping of Particles by Radiation Pressure", *Physical Review Letters,* Jan. 26, 1970, pp. 156–159, vol. 24, No. 4, The American Physcial Society.

Ashkin, A., et al., "Optical trapping and manipulation of single cells using infrared laser beams", *Nature,* 24/31Dec., 1987, pp. 769–771, vol. 330, London, Great Britain.

Renn, M.J., et al., "Laser Guidance and Trapping of Mesoscale Particle in Hollow–Core Optical Fibers", *Physical Review Letters*, Feb. 15, 1999, pp. 1574–1577, vol. 82, No. 7, The American Physical Society.

Renn, M.J., et al., "Particle manipulation and surface patterning by laser guidance", *Journal of Vacuum Science & Technology B,* Nov./Dec. 1998, pp. 3859–3863, vol. 16, No. 6, American Vacuum Society.

* cited by examiner (a)  10 μm (b)  10 μm

| MATERIALS | MANIPULATED |
|---|---|
| METALS | Au, Ag, Pd, Rh, Pt |
| DIELECTRICS | GLASS, BaTiO3, Al2O3 |
| SEMICONDUCTORS | Si, Ge, CdS, InO |
| LIQUIDS | H2O, ACIDS, BASES, SOLVENTS, SALT SOLUTIONS |
| PLASTICS | POLYSTRYRENE |
| BIOLOGICAL | EMBRYONIC NERVE AND ZLIAL CELLS, BACTERIA, MICROTUBLES |
| SUBSTRATES | USED |
| GLASS, CERAMIC, PLASTIC, PAPER, S , KAPTOH | |
| LINE DIMENSIONS | 3mm ± 0.5mm |

FIG. 10

LASER-GUIDED MANIPULATION OF NON-ATOMIC PARTICLES

This application is a continuation of U.S. patent application Ser. No. 09/408,621, filed Sep. 30, 1999 and claims the benefit of the filing of U.S. Provisional patent application Ser. No. 60/102,418, entitled "Direct-Writing of Materials by Laser Guidance", filed on Sep. 30, 1998, and the specification thereof is incorporated herein by reference.

BACKGROUND OF THE INVENTION

1. Field of the Invention

The present invention relates generally to, the field of optical guides. More specifically, the present invention relates to the method and apparatus of confining a non-atomic particle in a laser beam and guiding the particle confined in the laser beam through a hollow core optical fiber.

2. Background Art

Radiation pressure based transportation of atomic sized particles has been used to achieve high precision non-mechanical manipulation of such particles. An atom placed in an optical beam is attracted to or repelled from regions of high intensity, depending on the polarizability of the atom at the optical frequency. In particular, laser guidance of non-atomic particles utilizes optical forces arising from the deflection and scattering of light, which forces enable the confinement of a particle inside a laser beam and then manipulate the confined particle in a desired way. The existence of such optical forces was used in a number of optical traps. For example, optical tweezers allow dielectric particles to be trapped near the focus of a tightly focused high power laser beam and are used to manipulate biological particles, such as viruses and bacteria, microorganisms, blood and plant cells, and chromosomes. Optical tweezers allow a user to manipulate small particles in aqueous medium, but they do not allow the user to perform the same manipulation in the air. Optical traps for atoms are used in investigations of ultra cold collisions and collective effects of trapped atoms.

Most known techniques for trapping atoms in a tightly focused laser beam and transporting atoms together with the laser beam have limitations in that the trapping occurs only in a small region near the focal point of the laser. As a result, imaging and detecting devices utilizing optical traps must be built around a sample chamber, which often limits the size of the chamber in the devices. Since trapping and transporting particles occurs inside the chamber, then such imaging and detection devices require that the laser beam be steered from outside the chamber. Moreover, optical trapping forces are typically not large enough to trap particles in the laser beam, if the background medium in the chamber is turbulent or convective. Furthermore, in the optical tweezers method and device only a substantially transparent particle possesses such optical qualities that the axial force exerted on the particle in a laser beam can trap the particle inside the beam.

To improve the ways to manipulate particles through various media over longer distances, and to transport cold atoms from one vacuum system to another, the technique of guiding atoms through a hollow core optical fiber was devised. Fiber-guided atoms are deflected from the inner surface of the fiber by light that is also guided in the fiber. Optical forces induced by the laser light guided in a fiber may be used to reflect atoms from the inner wall of a hollow core optical fiber. In such a setting, laser light is coupled to the lowest-order grazing incidence mode and the laser frequency is tuned to the red side, so that atoms are attracted to the high intensity region at the center of the fiber. Atoms guided in a fiber this way undergo a series of lossless oscillations in the transverse plane and unconstrained motion in the axial direction.

While the method of guiding atoms through optical fibers was a step forward in developing means for manipulating and transporting particles from a source to a desired destination, an inherent limitation of such a method was the atomic size of a manipulated particle. Because of the atomic size, the wave length of the guiding laser beam had to be close to that of an atomic transition, and the manipulation itself could be performed only in a vacuum, therefore, requiring a special vacuum chamber. The transportation process of atomic particles itself is limited to transporting a few kinds of materials, essentially ruling out manipulating and guiding atoms of a broad range of materials. In nanofabrication processes (guiding atoms and precisely depositing them on a substrate to form nanometer size features), operating with atoms does not allow achievement of high throughput, as it would be desirable in any industrially applicable technique.

The need, therefore, exists to provide a method and device for manipulating and guiding microscopic (non-atomic) particles through a suitable medium along straight and bent trajectories. It is also desirable to provide such method and device, capable of guiding particles of a wide range of materials in non-vacuum environment and depositing the particles on various kinds and shapes of substrates.

SUMMARY OF THE INVENTION

To address the above-described need and provide a solution to the enumerated problems, it is, therefore, the object of the present invention to develop a particle guide for a non-contact, non-mechanical manipulation of atoms, clusters and micron-size particles. The invention provides a method and device which use laser light to trap particles optically within the hollow region of a hollow core optical fiber and flexibly transport the particles along the fiber over long distances.

It is another object of the present invention to provide a technique for guiding a wide variety of particles, including biological and aerosol particles, along the optical fibers to desired destinations.

It is yet another object of the present invention to have a method and device for guiding particles in an ambient, aqueous or gaseous environments, including an inert gas environment, which may be desirable for fabrication purposes.

It is also an object of the present invention to deliver liquid and solid particles to a substrate by method of laser guidance in hollow core optical fibers after extracting the particles from source backgrounds, which method allows a user to fabricate micron-size surface structures, such as, for example, electrical circuits and micro-mechanical devices, on a virtually unlimited variety of substrates, including semiconductors, plastics, metals and alloys, ceramics and glasses. The particles deposited on such substrates can be metals and alloys, semiconductors, plastics, glasses, liquid chemical droplets and liquid droplets containing dissolved materials or colloidal particles.

Also an object of the present invention is to use fiber optic particle guides for non-contact, non-mechanical manipulation of microscopic particles. The particles include those, which are biological in origin, such as bacteria, viruses, genes, proteins, cells, and DNA macromolecules. The particles can also be inorganic, such as glass, polymers, and liquid droplets.

Another object of the present invention is to provide a method of controlling and manipulating non-atomic particles by trapping them within an optical fiber anywhere along the length of the fiber.

In particular, the laser guiding device comprises a laser beam source generating a laser beam, which is directed to an entrance of a hollow core optical fiber by a focusing lens. A source of the particles to be guided through the fiber provides a certain number of particles near the entrance to the fiber. The particles are then drawn into the hollow core of the fiber by the focused laser beam, propagating along a grazing incidence path inside the fiber. Laser induced optical forces generated by scattering, absorption and refraction of the laser light by a particle traps the particle close to the center of the fiber and propels it along. It will be described in more detail below that any micron-size material, including solid dielectric, semiconductor and solid particles as well as liquid solvent droplets, can be trapped in laser beams and transported along optical fibers due to the net effect of exertion of these optical forces. After traveling through the length of the fiber, the particles can be either deposited on a desired substrate or into an analytical chamber, or dealt with depending on the goal of a particular application.

In another embodiment of the present invention, the same principle of particle manipulation can be used to levitate particles inside a hollow core fiber. In such an apparatus, particles or liquid droplets captured by a tightly focused laser beam are drawn into a vertically positioned fiber. After a certain distance inside the fiber, the propelling axial optical force pulling the particle up will be balanced by the gravitational force acting on the particle. Such a balance of forces makes the particle levitate in an equilibrium position, allowing the estimation of the magnitude of the propelling force. Similarly, if a particle is trapped in a horizontally positioned optical fiber by two laser beams entering the fiber from two opposing ends of the fiber, the particle will levitate in a certain equilibrium position inside the fiber where a variation of the intensity of the lasers allows one to estimate the magnitude of the force confining the particle in the center of the fiber.

By directing particles along the fiber onto the substrate, micron-size features: of desirable shape can be fabricated by direct deposition of micron-size particles. Such features are built up by continued addition of particles, which can be fused together on the substrate by various techniques including in-flight melting of the particles, and subsequent coalescence of molten droplets on the substrate, simultaneous deposition of solid particles and liquid precursors, wherein the liquids serve to fill the gaps between solid particles, coalescence of liquid precursors on the substrate and subsequent decomposition by laser heating to form the final product on the substrate, sintering of the deposited material by laser, or chemical binding.

BRIEF DESCRIPTION OF THE DRAWING FIGURES

FIGS. 6(a)–(e) are microscopic pictures of crystal deposition for $BaTiO_3$, $In_2O_3$, Ag, $Al(NO_3)_3$, and $Al_2O_3$, respectively.

FIGS. 7(a)–(d) are snapshots showing levitation of a water droplet in a curved section of an air-filled fiber.

Figure 8:
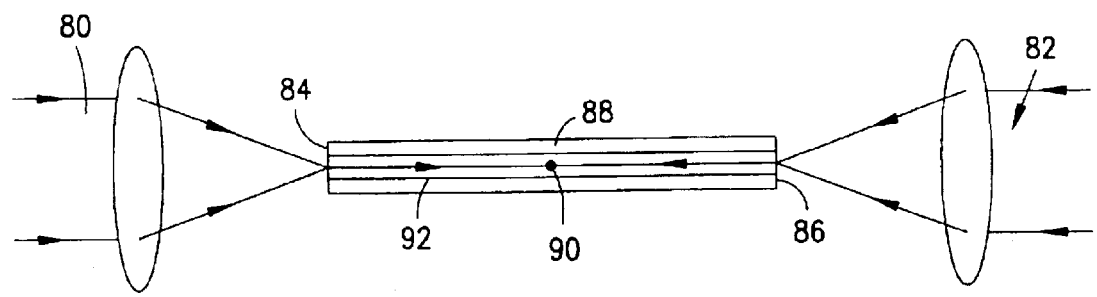

FIG. 8 is a schematic representation of a two-laser trapping apparatus.

Figure 9:
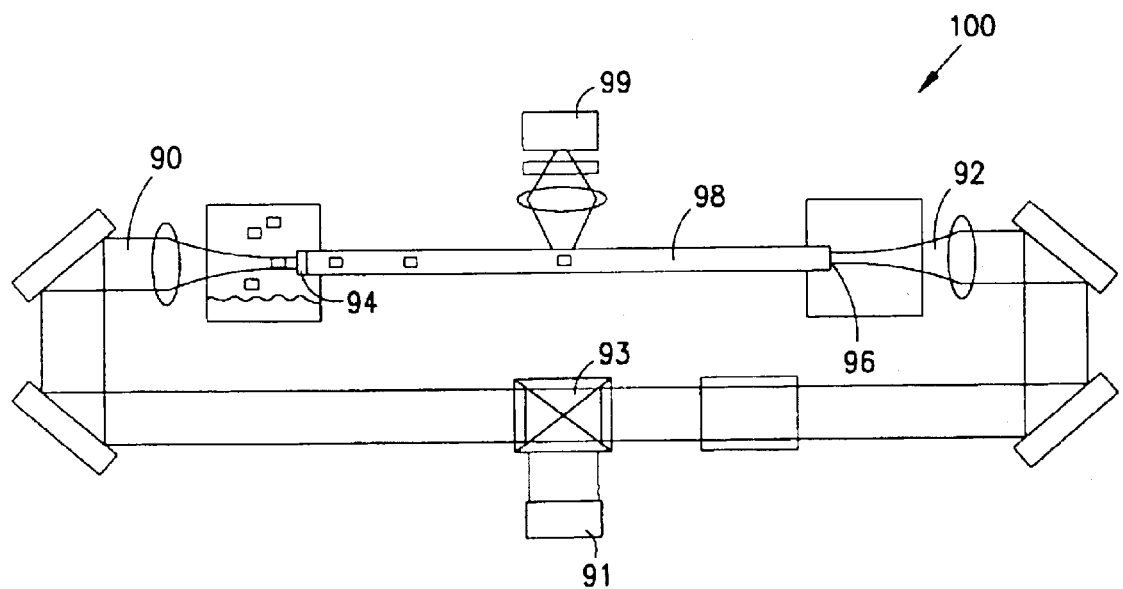

FIG. 9 is a schematic representation of another embodiment of a two-laser trapping apparatus.

FIG. 10 is a table listing materials manipulated by laser guidance on a variety of substrates.

DETAILED DESCRIPTION OF THE INVENTION

In the following detailed description of the invention references are made to the accompanying drawings, which for a part thereof, and in which specific preferred embodiments for practicing the invention are shown by way of illustration. These embodiments are described in sufficient detail to enable those skilled in the art to practice the invention, and it is to be understood that other embodiments may be utilized and that logical, mechanical, chemical and electrical changes may be made without departing from the spirit and scope of the present invention. The following detailed description is, therefore, not to be taken in a limiting sense, and the scope of the present invention is to be defined only by the appended claims.

Figure 1:
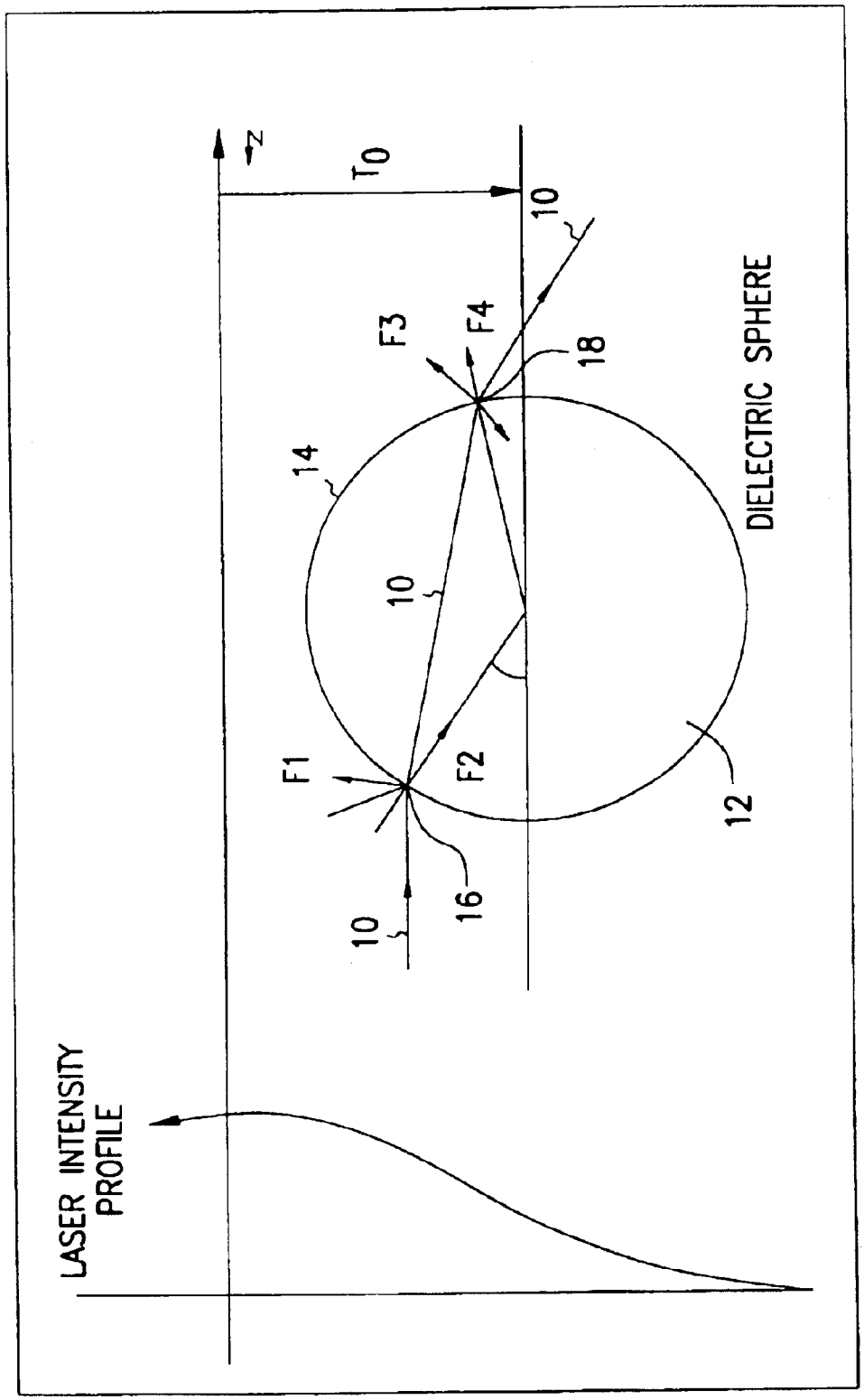
FIG. 1 is a schematic representation of optical forces exerted on a particle.

Optical forces arise from the reflection and refraction of light at a particle/environment interface. When the size of a particle is large compared to the wave length of the incident light, the forces acting on the particle can be described in a geometrical ray approximation. Referring to FIG. 1, s single optical laser ray 10 from a laser beam is shown striking a sphere 12 having a refractive index ns larger than a refractive index film of the surrounding medium. In this example, sphere 12 is a dielectric sphere made of an optically transparent material, so it is optically transparent to ray 10. Incident on an interface 14, ray 10 undergoes partial reflection and refraction at that interface. A portion of incident ray 10 reflected at interface 14 is known as radiation pressure. The first time a portion of ray 10 is reflected when ray 10 enters sphere 12 at an entrance point 16, creating radiation pressure force $F_2$ perpendicular to the surface of sphere 12 and directed toward the center of the sphere. The second time a portion of ray 10 is reflected is when the ray exits sphere 12 at an exit point 18, creating radiation pressure force $F_4$, also perpendicular to the surface of sphere 12, but directed outwardly. Portions of ray 10 which are refracted at the surface of sphere 12 when the ray enters and exits the sphere at points 16 and 18 creates forces $F_1$ and $F_3$, respectively. Force $F_1$ is perpendicular to the direction of the refracted ray 10 propagating inside sphere 12. Similarly, force $F_3$ is perpendicular to the direction of the once again refracted ray 10 propagating outside sphere 12 after exiting the sphere. The sum of the forces $F_1$–$F_4$, in addition to forces arising from multiple reflections inside the sphere, gives the total force acting on sphere 12 from the ray 10.

If total forces from all possible rays incident of sphere 12 are calculated and added up, the summation will give the two resulting net forces. The first net force is a confinement force (also known as a gradient force), acting in the radial direction toward the increase of the laser intensity. The second net force (also known as a radiation pressure force) acts along the axis z of the laser beam and results in propelling sphere 12 along the direction of laser propagation. Consequently, optical forces exerted by a laser beam on sphere 12 simultaneously pull the sphere toward the center of the laser beam and accelerate the sphere along the direction of propagation of the beam. It is important to note that the mechanism of guiding non-atomic particles through optical fibers utilized in the present invention is different from that of guiding atoms. Most notably, optical forces causing confinement and propulsion of a non-atomic particle in a fiber are based on non-resonant scattering of light, as described with regard to FIG. 1. To the contrary, atomic laser guidance is based on resonant interactions between the laser field and an atom.

In order to obtain such magnitude of the radiation pressure and gradient forces, high intensity laser fields are required, which is normally achieved in tightly focused laser beams. As a result, optical forces sufficient to trap and propel particles occur only near the laser beam waste in a hollow core of an optical fiber. In the fiber, a high intensity region extends along the length of the fiber, providing for the propulsion as well as confinement of the particles inside the fiber. When a laser beam propagates along the fiber, the beam doesn't diverge, but extends along the length of the fiber, making it possible to carry the particle along the same fiber.

Figure 2:
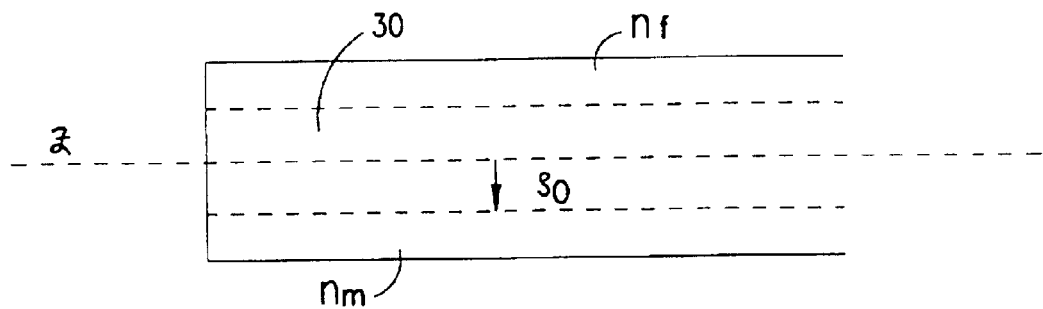
FIG. 2 is a front view of a hollow core optical fiber.

The radial profile of the lowest order optical mode couple to a hollow fiber is well represented by a zeroth order Bessel function $J_o(X\rho)$, where $X=2.4/\rho_o$, and $\rho_o$ is the radius of a hollow core region 30 of the fiber, as shown in FIG. 2. The lowest loss grazing-incidence mode has radial $\rho$ and axial $z$ intensity dependence given by:

$$I(\rho,z)=I_o[J_o(X\rho)]^2 \exp(-z/z_o), \quad (1)$$

where $I_o$ is the intensity of the laser filed at $\rho=0$.
$z_o$ is a decay length, given by $$z_o=6.8(\rho_o^3/\lambda^2)([v^2-1]^{-1/2}/[v^2+1]), \quad (2)$$

where $v$ is the ratio a fiber wall refractive index nf to the hollow core refractive index nm of the medium in the hollow core region, $\lambda$ is the laser wave length in the hollow region, $z$ is the distance from the beginning of the fiber. As follows from (1), the intensity of the laser field has a maximum in the center of the fiber where $\rho=0$ and slowly decreases along the length of the fiber as $\exp(-z/z_o)$. Decay length $z_o$ sets the limit on the distance along which particles can be guided. In general, $z_o$ is calculated using equation (2) for a specific fiber geometry, laser wave length, and refractive indices of the fiber core and walls. An estimate of (2) provides a practical limit to a guidance distance of up to 100 m.

Figure 3:
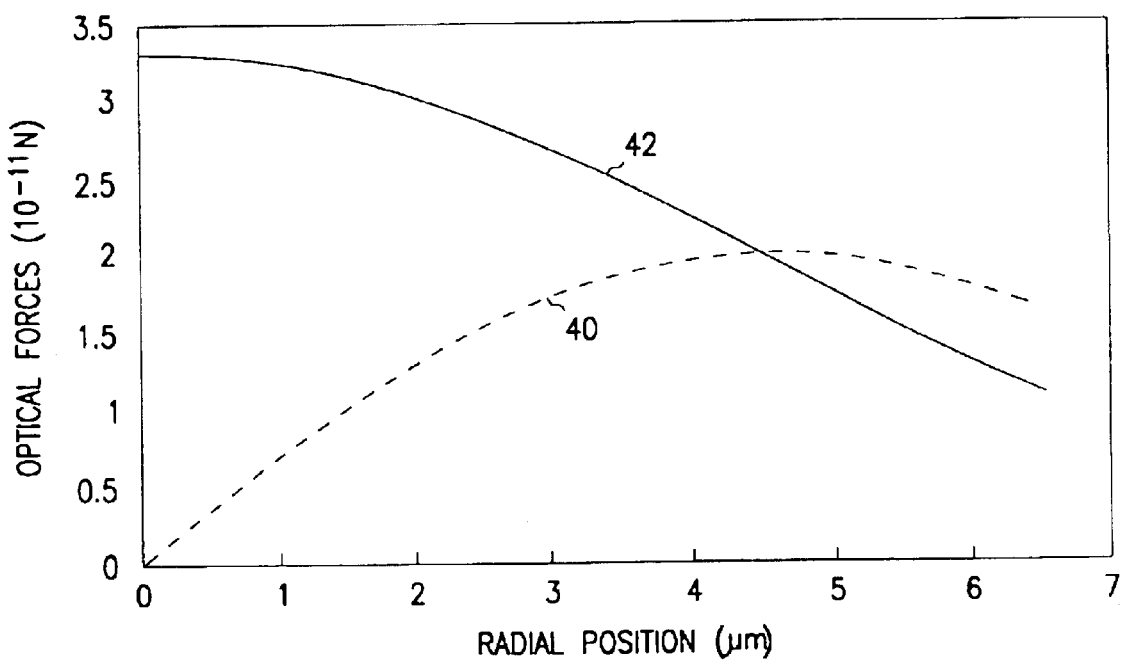
FIG. 3 is a graph illustrating the dependence of optical forces on a radial position.

An example of calculation of optical forces exerted on dielectric particles having a radius larger than the wavelength of a laser is shown in FIG. 3, which depicts radial dependence of the axial scattering and radial gradient forces on a 7 $\mu$m polystyrene sphere (ns=1.59) near the entrance of a water-filled fiber using the geometric ray formalism and equation (1) for the intensity profile calculations. The experimental conditions were the following: a 3.6 mm diameter, 240 mW laser beam was coupled with 90% efficiency into a 20 $\mu$m fiber. As seen in FIG. 3, a gradient force 40 increases nearly linearly with small displacements from the fiber center indicating a restoring force drawing the particle back to the high intensity central region of the fiber. An axial force 42 in FIG. 3 is nearly constant for small displacements from the center.

Figure 7:
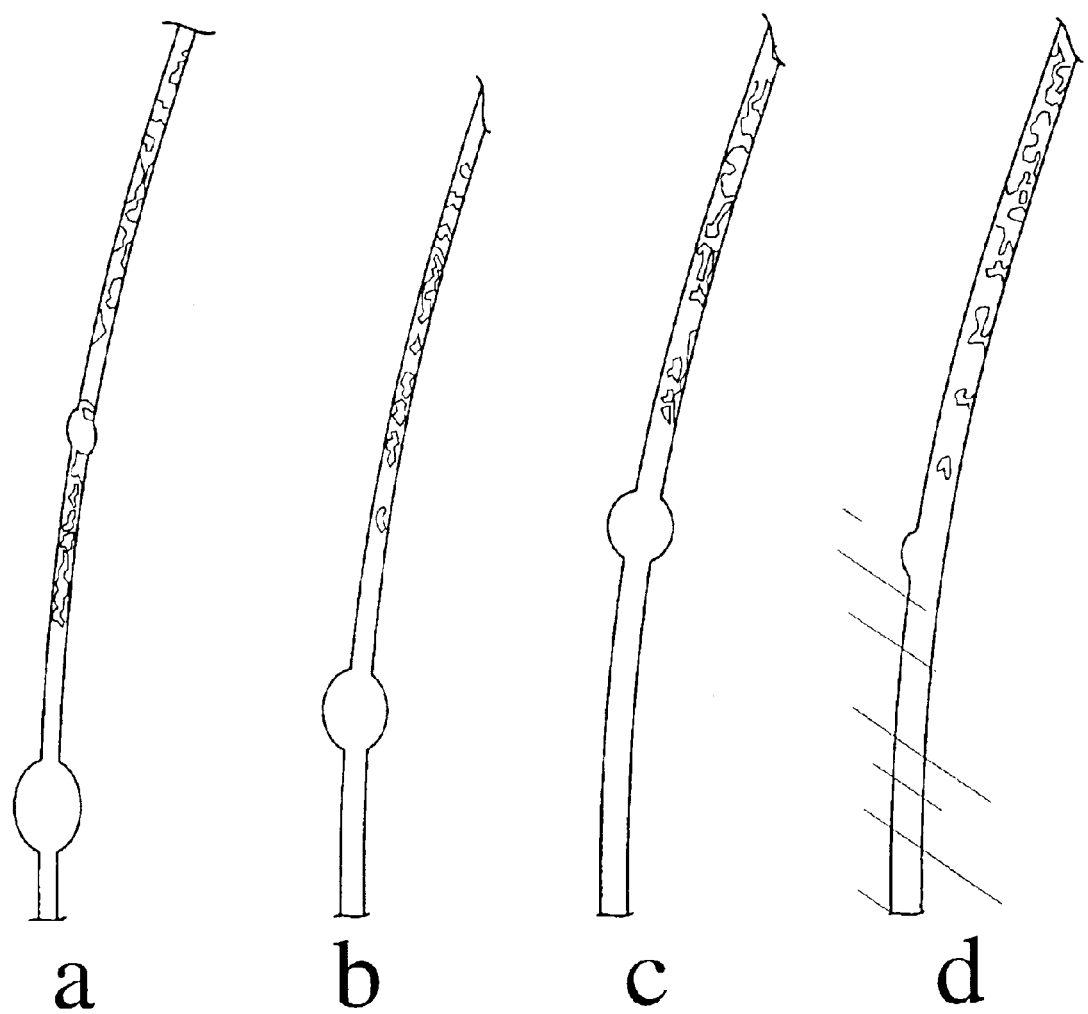

As follows from the theoretical basis and experimental results described above, since an intense laser beam inside the hollow core fiber has a proper profile and, therefore, the trapped particle is damped by the fluid inside the fiber, the particle is confined inside the laser beam and can be transported with the beam without bouncing off the inside walls of the fiber. The size of the particles capable of being guided that way can vary from about 50 nm to about 10 $\mu$m. The higher the refractive index of a particle, the larger the optical forces exerted on the particle, and, consequently, the easier it is to manipulate and transport such a particle. Besides water droplets and polystyrene spheres, the substances guided through the fibers were salt, sugar, KI, CdTe, Si and Ge crystals, Au and Ag particles with sizes ranging from about 10 nm to about 10 $\mu$m using a 0.5 W laser and a 117 $\mu$m inner-diameter air-filled fiber. Listed in Table 1 in FIG. 10 are the materials manipulated by laser guidance on a variety of substrates. Since metal particles, such as Au and Ag, for example, usually reflect light well and absorb very little light, larger metal particles can be transported along the hollow core fibers faster. Moreover, since the use of hollow core fibers allows manipulation of a wide variety of particles and virtually opens up the non-contact, non-mechanical way of transporting numerous materials, living cells can be manipulated and guided through the fibers in liquid environments. Examples of the results of fiber guiding for several types of dielectric particles are shown in FIGS. 7(a)–(d). Each image of a short section of fiber in FIG. 7 is captured on a CCD camera. FIGS. 7(a)–(c) show snapshots of polystyrene spheres guided in a water filled fiber. FIG. 7(d) shows an example of a particle guided in an air filled fiber. The track of scattered light in FIG. 7(d) indicates a trajectory of a 1 $\mu$m water droplet in a 20 $\mu$m diameter fiber.

One of the many applications of particle laser guidance is direct-write patterning of surfaces, which utilizes optical forces to transport particles through hollow core optical fibers and deposit the transported particles on surfaces. In the laser guidance and surface patterning apparatus 44 depicted in FIG. 4, laser light 46 is focused into the hollow region 48 of a hollow core fiber 50 and guided in a low order grazing incidence mode. Aerosol particles 52 created by a nebulizer 54 and situated near the fiber entrance 56 are funneled into the hollow region 48 by optical gradient and scattering forces, and then guided to a substrate 58. For best results, substrate 58 is usually placed between 10 $\mu$m and 300 $\mu$m from the end of the fiber, because at larger distances the optical forces decrease rapidly and can't continue to confine the particles.

The material used in surface patterning is usually either dissolved or suspended in a liquid 60. The material can be a crystalline substance, such as, for example, barium titanate (a common capacitor material for electronic applications), or a dissolved precursor material, such as silver nitrate, which can be decomposed to the final product by heating inside the laser beam during transportation. It is contemplated that many other materials are capable of being transported to a surface and deposited on the surface. When an aerosol mist 62 is generated by the nebulizer 54, the mist is directed into the laser beam 46 near an entrance 56 of the hollow fiber 50. Laser scattering and gradient forces at the entrance 56 draw the aerosol particles 52 toward the center of the laser beam 46 and propel them into the fiber 50. As the aerosol particles travel through the fiber 50, excess solvent evaporates; leaving behind solid crystal particles. In case of precursor particles, heating inside the laser beam can decompose the particle to the final material to be deposited, such as, for example, decomposing silver nitrate to silver to be put on the substrate. Such a drawing technique can be of general application and used to draw a wide variety of materials into a laser beam. Precursors for virtually any material used in electronics are available and known.

Coupling the laser beam 46 into the fiber 50 is accomplished with the help of a lens 64 that matches the fiber mode radius to the Gaussian beam waste. In one of the embodiments of the apparatus 44, for a fiber having an inner diameter of 20 µm, a 0.05 numerical aperture (NA) lens gives a coupling efficiency better than 90% into the lowest order mode. It is possible to use lenses with a larger NA, which lenses excite rapidly decaying high-order nodes. Considerable care must be given to angular alignment of the incident laser light to, the fiber—a misalignment of about 1 degree excites high-order modes and results in the guided particles hitting the inside wall of the fiber Referring now to FIG. 5 as an illustrative example, patterning experimental results are shown for NaCl crystallites guided by a diode laser onto a glass cover slip by the apparatus described above and depicted in FIG. 4. In that example, a 250 W/$\lambda$=800 nm laser beam was coupled into an 8 mm long fiber having a 20 µm diameter of the inner hollow core. (In other successful direct writing experiments a laser beam of 400 mW having the wavelength of 800 nm was used). NaCl crystals were dissolved in distilled water to form a saturated solution. The droplets of the solution were launched into the laser beam by the nebulizer. Since optical forces are a strong function of particle size, scaling approximately as a square particle size, the largest droplets are preferentially captured and guided into the fiber. As the droplets begin to propagate along the fiber, the water in the droplets evaporates after about 2 mm of travel into the fiber, so the solid NaCl crystals are formed and then guided along the rest of the fiber onto the glass cover slip.

As seen in FIG. 5, the first two patterns (66 and 68, respectively) correspond to a single NaCl crystallite guided and delivered to the glass surface (as substrate 58 In FIG. 4). The other three patterns (70, 72, and 74 in FIG. 5) correspond to structural features formed by multiple NaCl crystallites. The spot diameter of each pattern is about 5 μm, which is significantly smaller that the 20 μm diameter of the inner hollow core of the guiding fiber. This observation confirms the fact that the radial optical forces confine the crystallites to the center of the hollow core. It was estimated that the size of each crystallite is about 1 μm for a saturated NaCl solution. The size of a crystallite on a substrate can be reduced by reducing the concentration of NaCl in the initial solution.

Another experimental example of direct writing presents patterns of $BaTiO_3$, $In_2O_3$, Ag, $Al(NO_3)_3$ and $Al_2O_3$ crystal deposition, which are shown in FIGS. 6(*a*), 6(*b*), 6(*c*), 6(*d*) and 6(*e*), respectively. The lines of crystals in FIGS. 6(*a*)–6 (*e*) were drawn at various micrometer translation rates during the deposition. The $BaTiO_3$ crystals were guided by a 1W/532 nm laser and transported through a 14 μm diameter, 4 mm long fiber.

By directing particles along the fiber 50 onto the substrate 58 (shown in FIG. 4), micron-size features of desirable shape can be fabricated. As noted above, the direct deposition of nanometer-size particles, called nano-fabrication, allows a user to build features of less than 100 nm on a substrate, which is currently the smallest feature achievable in photo lithographic processes. Such features are built up by continued addition of particles, which can be fused together on substrate 58 by various techniques, including in-flight melting of the particles, and subsequent coalescence of molten droplets on the substrate, simultaneous deposition of solid particles and liquid precursors, wherein the liquids serve to fill the gaps between solid particles, coalescence of liquid precursors on the substrate and subsequent decomposition by laser heating to form the final product on the substrate, sintering of the deposited material by laser, or chemical binding. The structural features can be composed of a wide variety of materials, such as metals, semiconductors, and insulators. Table 1 in FIG. 10 lists the types of materials, which were manipulated by hollow-core laser guidance, as well as substrates and linear dimensions.

Since the current invention makes it possible to create surface structural features less than a micron in size, thus implementing the invention in circuit board printing processes increases the density of electrical circuits. Circuitry can be written on substrates made of plastics, metals, ceramics and semiconductors with a wide range of materials described above deposited on such substrates with high throughput. An additional implementation of the laser guided direct writing is the direct write process on an arbitrary shaped substrate, allowing the circuitry to conform to the shape of the substrate. Such direct writing on micron-sized structural features can be used to write unique identification markers, as well as to prototype micro-mechanical devices in the rapidly growing micro-electro-mechanical systems industry. Moreover, since the direct writing technique can be used to write electrical circuits on a virtually unlimited variety of substrates, the products in which the technique can be used include wireless communication devices, "smart" credit cards, and embedded circuitry in biological implants.

Electrical circuit fabrication, which calls for fully dense, continuous, micron-size patterns, can be achieved by the direct-write laser guidance method of the present invention. For example, particles can melt during laser transportation, so the molten particles flowing together on to the substrate are deposited on the substrate as fully dense patterns. The high laser intensity near the fiber entrance ($10^{12}$ W/m$^2$) can melt nearly any material by laser light absorption. Strongly absorbing materials, such as metals and alloys, melt at a low illumination (100 mW) within the first 100 μm of the fiber entrance. To melt weakly absorbing materials, such as transparent glasses and ceramics, either a laser beam having a material absorption wavelength or a more intense laser are usually required. In the apparatus in FIG. 4, the length of fiber 50 or the optical coupling mode can be adjusted, so that the entering particles (52 in FIG. 4) melt at fiber entrance 56, but the laser intensity at a fiber exit 59 is sufficiently low to minimize heating of substrate 58. Such low exiting intensity can be achieved by the appropriate choice of the length and diameter of the guiding fiber.

Another method of depositing materials onto a substrate is the use of precursors in depositions. A precursor is any material that can be decomposed thermally or chemically to yield a desired final product. In the laser material deposition method of the present invention, the desired product is a material to be deposited on the substrate. For example, silver nitrate is a salt that dissolves in water. Therefore, laser guiding the droplets of the silver nitrate inside an optical fiber heats the droplets confined in the laser beam, yielding the final material, silver, which is then deposited on the substrate. Alternatively, heating of the droplets can be accomplished by any other conventional means. Heating and decomposing indium nitrate is another example of using precursors in laser deposition. Guiding and heating indium nitrate in the laser beam inside an optical fiber decomposes is to a transparent semiconductor, indium oxide.

Yet another way of depositing a desired material onto a substrate is to use a liquid droplet to transport a smaller sold particle of the desired material by using laser guidance and deposition. During transportation, the liquid droplets evaporate, leaving smaller solid particles, which can be then deposited onto the substrate. In many cases it is easier to guide and deposit precursors rather than the final desired materials.

Figure 4:
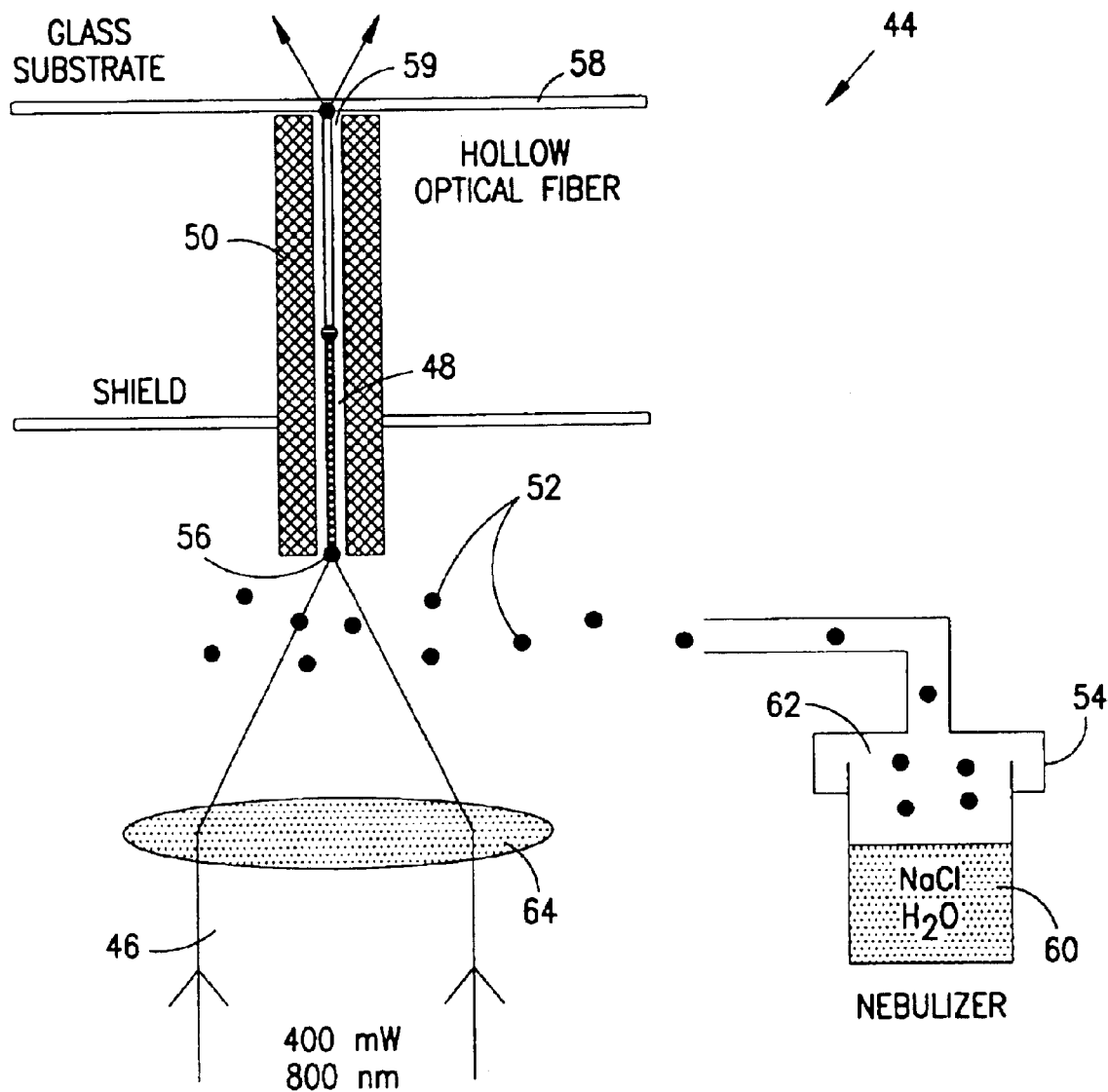
FIG. 4 is a schematic representation of a laser guidance apparatus.
Figure 5:
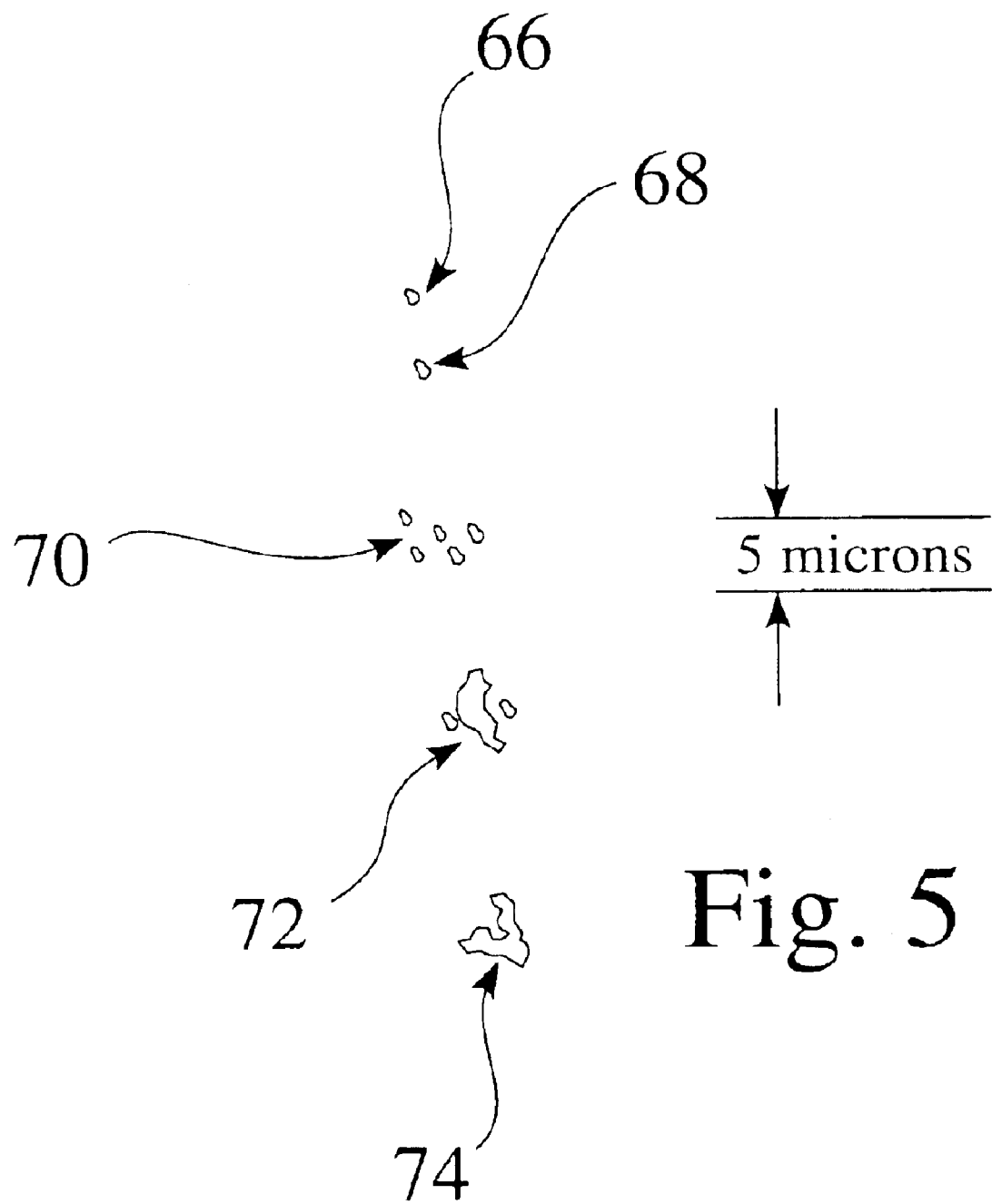
FIG. 5 is a microscopic picture of a NaCl patterning example.
Figure 6A:
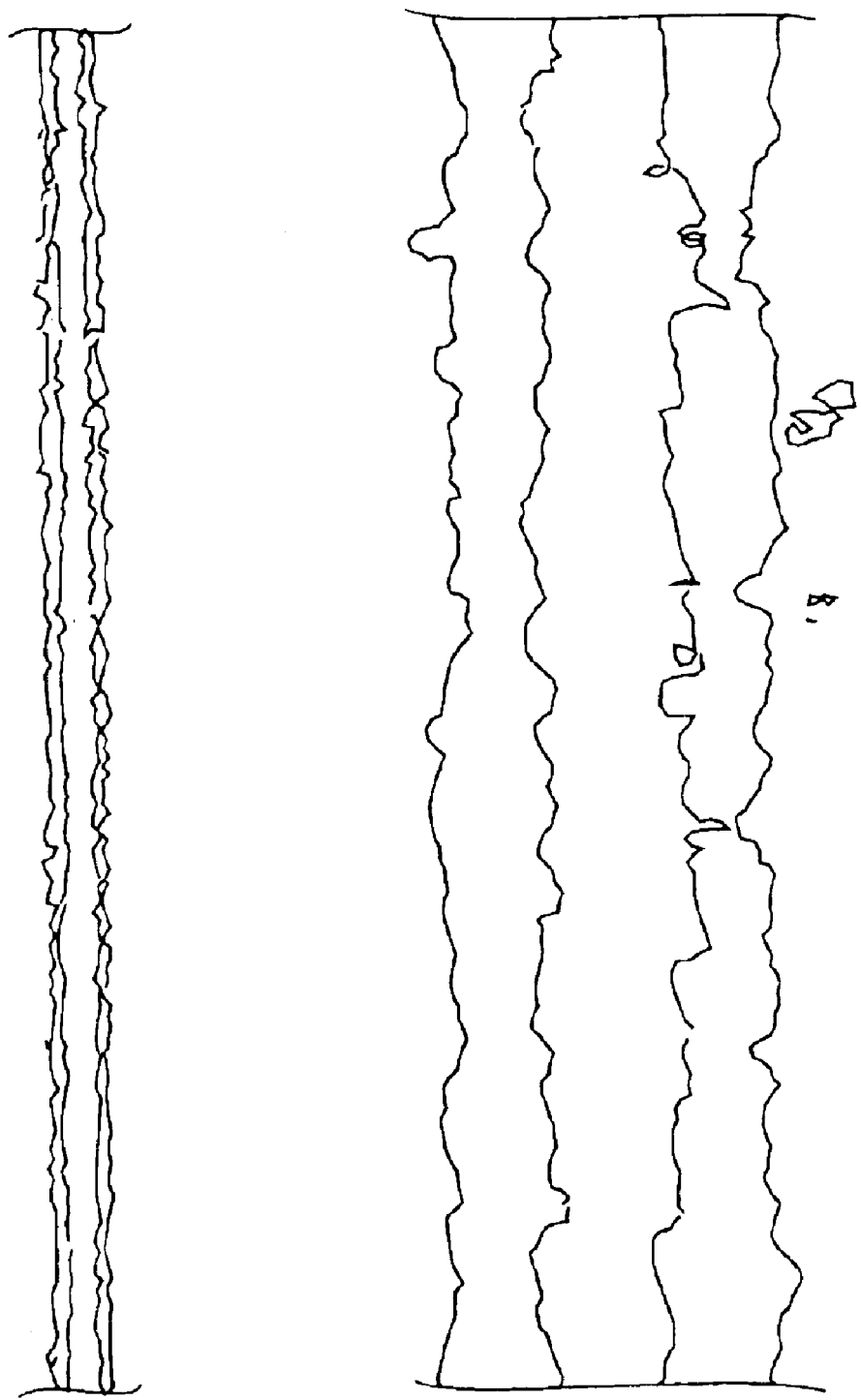
Figure 6B:
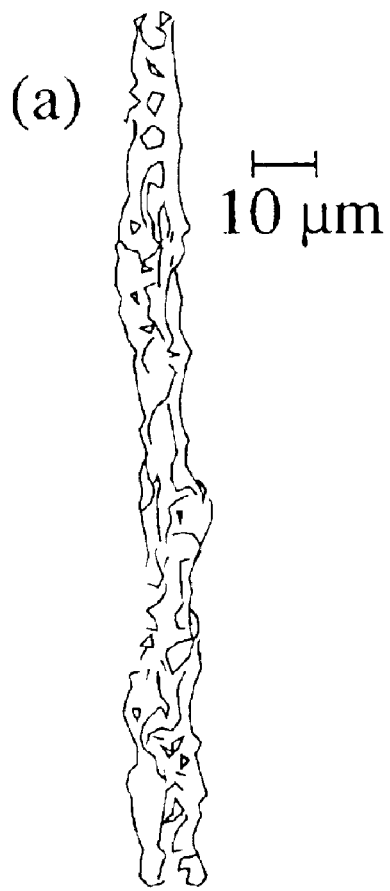
Figure 6C:
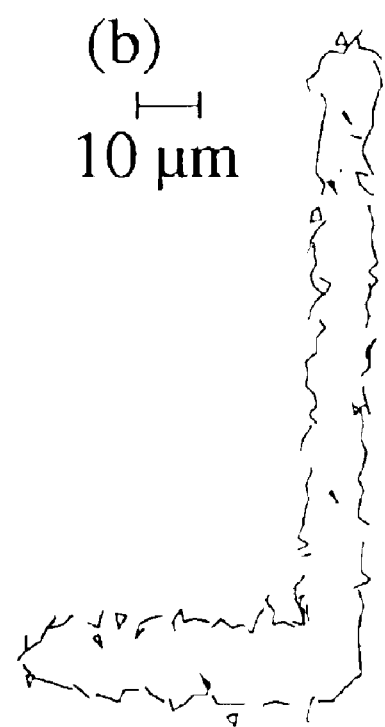
Figure 6D:
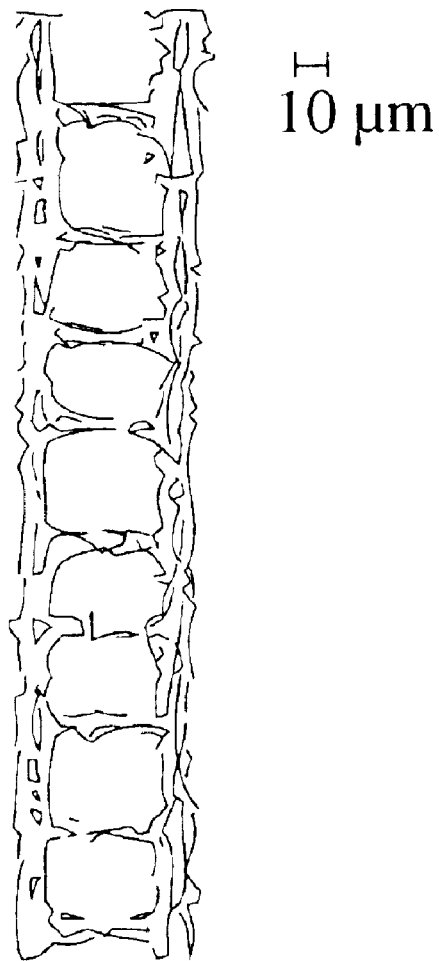
Figure 6E:

The same principle on which apparatus 44 in FIG. 4 is based can be used to provide an apparatus and method for laser levitation of individual crystallites. If a particle is guided along vertically located fiber 50 in FIG. 4, the force of gravity pulls the particle down while the axial optical force pulls the particle up the length of the fiber. Since the axial force becomes smaller with distance along the fiber, the two forces eventually balance each other and the particle remains levitated at an equilibrium height Since in such an equilibrium position the magnitude of the axial force propelling the particle upward is equal to the magnitude of the gravitational force pulling the particle down, the apparatus 44 can serve as a device for measuring the axial force, since the magnitude of the gravitational force is not difficult to calculate.

The snapshots in FIGS. 7(a)–(d) show the levitation of a 5 $\mu$m water droplet in a 5 mm curved section of an air-filled fiber. A 240-mW/800 nm laser beam is coupled with 90% efficiency into the lowest-loss mode. The 5 $\mu$m water droplets, estimated by optical microscopy, are funneled into the fiber by the laser light from a fog of droplets. The scattered light from the droplet in FIG. 7(a)–(d) is easily seen by the naked eye as the droplet travels through the fiber.

Another embodiment of a laser levitation apparatus is shown in FIG. 8. In that embodiment, laser beams 80 and 82 are launched into opposite ends 84 and 86 of a fiber 88, respectively. The axial forces exerted on a particle 90 from laser beams 80 and 82 inside a hollow core 92 of fiber 88 are opposite, canceling out at an equilibrium point inside the fiber. At the same point the force confining particle 90 to the center of hollow core 92 doubles in magnitude. By reducing the laser intensity, particle 90 will be pulled down by the gravitational force toward the lower part of the hollow core 92. Since the gravitational force can be easily calculated, measurements of the particle downwardly displacements provide a measure of the radial confinement force. Laser traps of the kind depicted in FIG. 8 have been constructed and tested for trapping liquids, salts, glasses and metals for several hours while monitoring the particles' dynamic behavior and scattering. By mixing droplets in such traps, chemical reactions were observed during the mixing process. Such an apparatus can be used for containerless processing of chemical droplets by mixing droplets by coalescence or laser heating the droplets confined in the laser beam to drive chemical reactions inside them.

Another application of a two-beam laser trap is an apparatus 100 for recording the emission spectrum of trapped particles, which apparatus is shown schematically in FIG. 9. The trap is formed by laser beams 90 and 92 directed into opposite ends 94 and 96 of a fiber 98. At some point inside fiber 98 optical scattering from laser beams 90 and 92 will balance, and the laser field will both confine and heat the particles inside the fiber. The laser beams 90 and 92 are formed by a beam splitter 93, which splits a laser beam generated by a source 91. The trapped particles optical emission spectrum is then recorded by a low light spectrophotometer 99. Apparatus 100 can be a useful tool in controlling fully dense direct writing and adhesion of particles to a substrate by determining and manipulating conditions for melting the particles. The conditions for melting can be determined by measuring the particle's temperature from the particle's radiative emission and by measuring temperature dependence on material, particle size, laser power and fiber dimensions. The particle's phase transition between solid and liquid can be determined from the changes in optical scattering patterns. The combined use of the emission spectrum and the scattering patterns of a particle will distinctly determine the melting temperature and conditions for controlling direct laser writing.

Although specific embodiments have been described and illustrated herein, it will be appreciated by those skilled in the art that any arrangement, which is calculated to achieve the same purpose may be substituted for the specific embodiments shown. Therefore, this application is intended to cover any adaptations or variations of the present invention. Therefore, it is manifestly intended that this invention only be limited by the following claims.

What is claimed is:

1. The method of depositing a material onto a substrate, the method comprising:

providing a solution containing the material;

transforming at least a portion of the solution into a plurality of non-atomic droplets of the material near a first opening of an optical conductor having a through channel;

confining the droplets inside a laser beam while directing the beam toward the first opening;

transporting the droplets inside the through channel from the first opening to a second opening of the optical conductor by causing the laser beam with the confined droplets to propagate between the first and the second openings in the through channel; and depositing the droplets of the material onto the substrate after the laser beam exits the second opening of the optical conductor.

2. The method of claim 1, wherein the substrate is selected from the group consisting of metals, alloys, insulators, semiconductors, polymers, and biological material.

3. The method of claim 1, wherein the material is selected from the group consisting of metals, alloys, dielectrics, semiconductors, liquids and biological material.

4. The method of claim 1, wherein the droplet size is larger than about 10 nm.

5. A method for depositing a material onto a substrate, the method comprising:

providing one or more particles comprising providing one or more liquid droplets;

confining one or more particles inside a laser beam while directing the beam toward a first opening;

transporting one or more particles inside the through channel from the first opening to a second opening of the optical fiber by causing the laser beam with the confined one or more particles to propagate between the first and the second opening to a second opening of the optical fiber by causing the laser beam with the confined one or more particles to propagate between the first and the second openings in the through channel;

treating one or more particles while transporting them inside the through channel, thereby providing the material for deposition; and depositing the material onto the substrate after the laser beam exits the second opening of the optical fiber.

6. The method of claim 5, wherein treating one or more particles comprises chemical or thermal treatment.

7. The method of claim 5, wherein providing one or more liquid droplets comprises providing a solution by dissolving the material in a solvent; and transforming the solvent into one or more liquid droplets.

8. The method of claim 5, wherein one or more particles are larger than about 10 nm in size or $10^{-21}$ liters in volume.

9. The method of claim 5, wherein one or more particles comprises a liquid portion and a solid portion.

10. The method of claim 9, wherein the solid portion is the material deposited onto the substrate.

11. A method of confining a particle inside a through channel of an optical fiber, the method comprising:

directing a first laser beam into the channel through a first opening of the optical fiber, directing a second laser beam into the channel through a second opening of the optical fiber; and confining the particle inside the channel by causing the first and the second laser beams to propagate toward each other inside the channel.

12. The method of claim 11, wherein the optical conductor is horizontal and wherein the first and the second openings are disposed opposite to each other.

13. The method of claim 11, further comprising changing an intensity of both of the laser beam or changing an intensity of one of the laser beams to change a position of the confined particle inside the channel.

14. A method of confining a particle inside a hollow portion of a optical fiber, the method comprising:

confining the particle inside a laser beam;

directing the laser beam with the confined particle into the hollow portion through a first opening of the optical fiber; and transporting the particle inside the hollow portion by causing the laser beam to propagate inside the hollow portion until a velocity of the particle reduces to about zero.

15. The method of claim 14, wherein the optical fiber is substantially vertical.

16. The method of claim 14, further comprising causing the laser beam to exit the optical fiber through a second opening.

* * * * *

UNITED STATES PATENT AND TRADEMARK OFFICE
CERTIFICATE OF CORRECTION

PATENT NO. : 6,823,124 B1  Page 1 of 1
APPLICATION NO. : 09/574955
DATED : November 23, 2004
INVENTOR(S) : Michael J. Renn, David J. Odde and Robert L. Pastel It is certified that error appears in the above-identified patent and that said Letters Patent is hereby corrected as shown below:

In the drawing Fig. 10, the words "ZLIAL CELLS" should read as "GLIAL CELLS"

Column 1, line 11, insert the following paragraph:

--STATEMENT REGARDING FEDERALLY SPONSORED RESEARCH OF DEVELOPMENT

The U.S. Government has a paid-up license in this invention and the right in limited circumstances to require the patent owner to license others on reasonable terms as provided for by the terms of Contract No. N00014-99-C-0258 awarded by the U.S. Department of the Navy.--

Column 3, line 44, delete ":"

Column 4, line 35, delete "ns" and substitute --$n_s$--

Column 5, line 37, delete "nf" and substitute --$n_f$--

Column 5, line 38, delete "nm" and substitute --$n_m$--

Column 8, line 62, delete "is to" and substitute --into--

Signed and Sealed this
Tenth Day of April, 2012

David J. Kappos
*Director of the United States Patent and Trademark Office*